METHODS OF MANUFACTURING SEMICONDUCTOR DEVICES

Filed Feb. 28, 1968 6 Sheets-Sheet 1

INVENTORS
KINJI HOSHI
CHIAKI KUMAZAKI
YOSHINORI AZUMA
TOSHITAKA TSUCHIHASHI
TOSHIRO KATO
SUSUMU TADOKORO

BY

ATTORNEY

METHODS OF MANUFACTURING SEMICONDUCTOR DEVICES

Filed Feb. 28, 1968

INVENTORS
KINJI HOSHI
CHIAKI KUMAZAKI
YOSHINORI AZUMA
TOSHITAKA TSUCHIHASHI
TOSHIRO KATO
SUSUMU TADOKORO
BY
[signature]
ATTORNEY

METHODS OF MANUFACTURING SEMICONDUCTOR DEVICES

INVENTORS
KINJI HOSHI
CHIAKI KUMAZAKI
YOSHINORI AZUMA
TOSHITAKA TSUCHIHASHI
TOSHIRO KATO
SUSUMU TADOKORO

BY

[signature]

ATTORNEY

METHODS OF MANUFACTURING SEMICONDUCTOR DEVICES

INVENTORS
KINJI HOSHI
CHIAKI KUMAZAKI
YOSHINORI AZUMA
TOSHITAKA TSUCHIHASHI
TOSHIRO KATO
SUSUMU TADOKORO

BY

ATTORNEY

April 20, 1971 KINJI HOSHI ET AL 3,575,731

METHODS OF MANUFACTURING SEMICONDUCTOR DEVICES

Filed Feb. 28, 1968 6 Sheets-Sheet 5

INVENTORS
KINJI HOSHI
CHIAKI KUMAZAKI
YOSHINORI AZUMA
TOSHITAKA TSUCHIHASHI
TOSHIRO KATO
SUSUMU TADOKORO

BY

ATTORNEY

INVENTORS
KINJI HOSHI
CHIAKI KUMAZAKI
YOSHINORI AZUMA
TOSHITAKA TSUCHIHASHI
TOSHIRO KATO
SUSUMU TADOKORO

BY
[signature]
ATTORNEY

United States Patent Office 3,575,731

Patented Apr. 20, 1971

3,575,731

METHODS OF MANUFACTURING SEMICONDUCTOR DEVICES

Kinji Hoshi, Chiaki Kumazaki, Yoshinori Azuma, Toshitaka Tsuchihashi, Susumu Tadokoro, and Toshiro Kato, Kanagawa-ken, Japan, assignors to Sony Corporation, Tokyo, Japan Filed Feb. 28, 1968, Ser. No. 708,946

Claims priority, application Japan, Mar. 1, 1967, 42/13,013, 42/13,014, 42/13,015, 42/13,016, 42/13,017

Int. Cl. H01l 7/00

U.S. Cl. 148—1.5 16 Claims

ABSTRACT OF THE DISCLOSURE

In the manufacture of a semiconductor device, a semiconductor substrate has a surface thereof etched or otherwise formed with at least one profiled portion, such as, a projection or recess, having a face offset from the surrounding areas of that surface and sides extending from the face to the adjacent surface areas, at least two layers of different conductivity types are sequentially deposited on the substrate surface by the vapor growth technique to cover at least the face and sides of the projection or recess, and either the substrate or the outermost layer of the resulting element is selectively removed to expose, adjacent the sides of the projection or recess, a cross-section of at least the layer which is closest thereto. In order to facilitate attachment of an electrode to a layer at the exposed cross-section by increasing the width of the latter, the plane to which material is removed may be directed obliquely to the sides of the projection or recess, as by inclining the sides, or the position of the projection or recess may be selected so that its face and sides respectively correspond to crystal faces of relatively small and large crystal growth speeds. The effective width of a layer at its exposed cross-section may also be increased by alloying a part of an adjacent layer or the adjacent region of the substrate so as to have the same type conductivity, or by applying a layer of the same conductivity to the adjacent layer or substrate only at the sides of the projection or recess by either the diffusion or vapor growth process.

This invention relates to semiconductor devices and to methods of manufacturing the same, and more particularly is directed to semiconductor devices having at least two semiconductor regions formed by means of the epitaxial vapor growth technique, and to methods for the manufacture of such semiconductor devices.

At present the vapor or epitaxial growth technique is widely used for the production of semiconductor regions or semiconductor devices. The vapor growth technique offers various advantages, such as, easy control of the impurity concentration of the resulting regions, flawless junctions, shortening of the time required for production of the semiconductor regions and precise definition of the thickness of the regions. In practice, however, existing methods have formed only one semiconductor region by means of the vapor growth technique and other semiconductor regions have been produced in a portion of the vapor growth region by means of diffusion techniques. Where the base region has been made extremely thin by the vapor growth technique to provide an enhanced current amplification degree $h_{FE}$, a lead wire cannot be attached to the base region, so that the diffusion process rather than the vapor growth technique, has been employed to form the base layer or region.

Accordingly, an object of this invention is to provide a semiconductor device having at least two semiconductor regions thereof formed by the vapor growth technique.

Another object is to effect the electrical separation or isolation of the elements of a semiconductor device in a manner to afford excellent characteristics to such device.

A further object is to provide a method of manufacturing semiconductor devices of high current amplification degree and excellent high-frequency characteristics.

Still a further object of this invention is to provide a method of manufacturing semiconductor devices which is composed of simple operation that can be completed in a relatively short time.

It has been found that the above mentioned disadvantages of the prior art methods can be avoided, and the semiconductor devices of high current amplification degree and excellent high-frequency and breakdown voltage characteristics can be produced by forming a surface of a semiconductor substrate with at least one profiled portion, such as a projection or recess, having a face offset from the surrounding surface areas and sides extending from the offset face to the surrounding surface areas, sequentially depositing on the substrate surface by the vapor growth technique at least two layers of different conductivity types to cover at least the face and sides of the projection or recess, and then selectively removing either the substrate or the outermost layer of the resulting element to a suitable depth so as to expose, adjacent the sides of the projection or recess, a cross-section of at least the layer which is closest thereto.

In order to facilitate attachment of an electrode at the exposed cross-section of a layer deposited by the vapor growth technique, for example, the layer constituting the base region of a semiconductor device, it is a feature of this invention to increase the effective width at the exposed cross-section of such layer while maintaining the desired small thickness thereof at the offset face of the projection or recess. The increase of the effective width at the exposed cross-section can be achieved by including the sides of the projection or recess so that the plane to which material is removed for exposing the cross-section is directed obliquely across the corresponding layer, or the position of the projection or recess of the substrate may be selected so that its face and sides respectively correspond to crystal faces of relatively small and large growth speeds. The effective width at the exposed cross-section of a layer may also be increased by alloying a part of an adjacent layer or the adjacent region of the substrate so as to provide the same type conductivity, or by applying a layer of the same conductivity to the adjacent layer or substrate only at the sides of the projection or recess either by the diffusion or vapor growth process.

Since all layers are deposited on the substrate by the vapor growth technique, the substrate can be continuously held in a furnace while being subjected to the various operations which merely involve changes in the kinds and controlled concentrations of the impurities introduced. Thus, the semiconductor device can be rapidly produced while maintained continuously in a furnace and dust or other contaminants are not likely to adhere to the substrate.

It has been found that the method according to this invention is of particular utility in the production of integrated circuits as the electrical separation or isolation of the elements of the circuit thus obtained enhances the characteristics of the completed circuit as compared with the characteristics of integrated circuits having diffusion or dielectric isolation of the elements, as heretofore employed.

The above, and other objects, features and advantages of this invention, will be apparent in the following detailed description of illustrative embodiments taken in conjunction with the accompanying drawings, wherein.

Figure 5B:
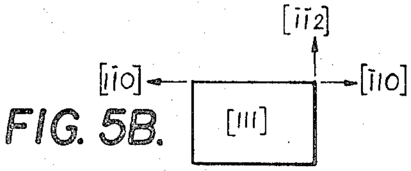
Figure 5A:
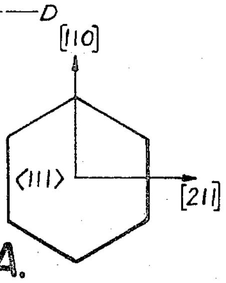

FIGS. 3A to 3D similarly illustrate the steps involved in a method according to another embodiment of this invention;

FIGS. 4A to 4D are another series of cross-sectional views showing the steps according to an embodiment of this invention by which the area available for electrode attachment is increased;

FIGS. 5A and 5B are schematic diagrams illustrating different crystal growth speeds at various faces of a crystal;

FIGS. 6A to 6E and FIGS. 7A to 7D respectively show series of schematic cross-sectional views illustrating the steps of methods according to further embodiments of the invention in which increased areas for electrode attachment are provided by suitable orientation of the crystal faces; and FIGS. 8A to 8F, FIGS. 9A to 9E, FIGS. 10A to 10E, FIGS. 11A to 11E, FIGS. 12A to 12E, and FIGS. 13A to 13F respectively represent the various steps in methods according to still another embodiment of the invention.

Generally, two method are used for electrical isolation of the individual elements constituting a semiconductor integrated circuit. One method is referred to as the diffusion isolation method which utilizes the backward characteristics of semiconductor junctions (PN junctions) formed by diffusion, while the other is referred to as the dielectric isolation method and employs insulating materials such as $SiO_2$, SiC and the like. The diffusion isolation method facilitates the manufacture of the integrated circuit and hence is widely used at present, but the resulting integrated circuit is relatively poor in its breakdown voltage and high frequency characteristics. Although integrated semiconductor circuits produced by the dielectric isolation method are not as different in their breakdown voltage and high frequency characteristics, this method introduces complexities and technical difficulties in the production of the circuits.

Figure 1A:
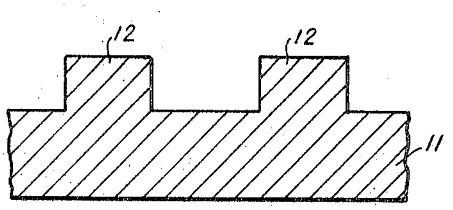
FIGS. 1A to 1E are a series of schematic cross-sectional views showing the steps involved in producing a semiconductor device in accordance with a prior art method.
Figure 1B:
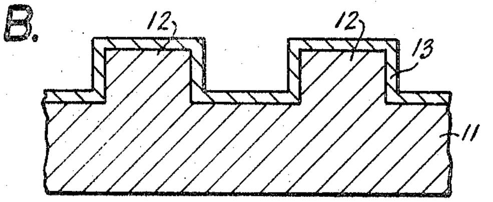
Figure 1C:
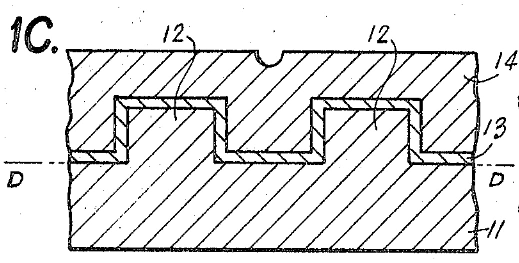
Figure 1D:
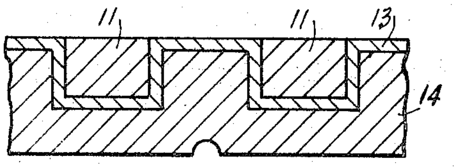
Figure 1E:
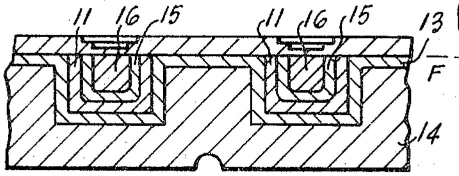

Referring now to FIG. 1, it will be seen that, in the use of the dielectric isolation method for the manufacture of a transistor, one or more projections 12 each defining the size of the finished transistor and the area and shape of the PN junction thereof, are formed on a semiconductor substrate 11, for example, an N-type monocrystalline silicon substrate, by means of etching or the like, as depicted in FIG. 1A. An insulating layer 13, for example, of $SiO_2$ or SiC, is deposited on the upper surface of substrate 11 including the projections 12 thereof, for instance, by the vapor growth or epitaxial growth technique, as shown in FIG. 1B. Following this, a polycrystalline silicon layer 14 is formed on the insulating layer 13, for example, by the vapor growth techniques, as illustrated in FIG. 1C. Thereafter, the underside of silicon substrate 11 is ground and etched away to about the line D—D on FIG. 1C so as to leave only the projections 12 of the substrate 11, each of which is covered with the insulating layer 13 except at the ground face, as illustrated in FIG. 1D. Then, a P-type base region 15 and an $N^+$-type emitter region 16 are formed in the remaining portions of the monocrystalline silicon substrate 11 by means of selective diffusion from the ground face, as depicted in FIG. 1E. In a similar manner a diode and a resistor may be provided and interconnected by metal vapor-deposited thereon, thus providing integrated circuits of the dielectric isolation type.

However, this prior method does not permit free and precise control of the impurity concentrations and their gradients in the base and emitter regions as all the semiconductor junctions are formed by diffusion techniques. Further, continuous manufacturing operations are impossible because each diffusion process usually takes one to two hours and photoresist and photoetching operations are involved in each diffusion process.

The present invention eliminates the foregoing disadvantages of the previously employed methods and will be initially described in detail with reference to the embodiment thereof illustrated by FIG. 2 of the drawings.

Figure 2A:
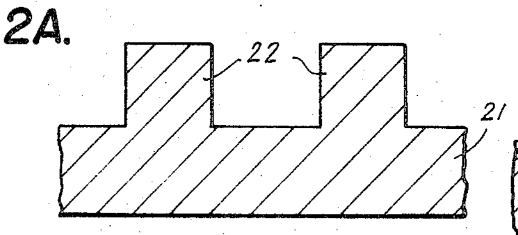
FIGS. 2A to 2F are a series of schematic cross-sectional views showing steps involved in producing a semiconductor device according to an embodiment of this invention.
Figure 2B:
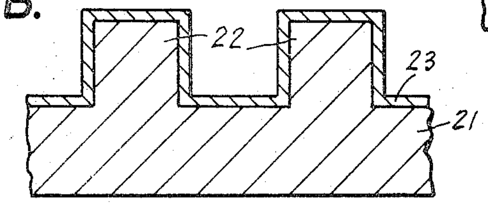
Figure 2C:
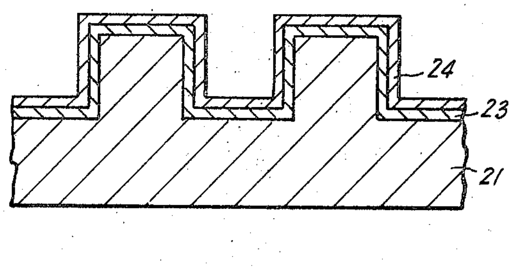
Figure 2D:
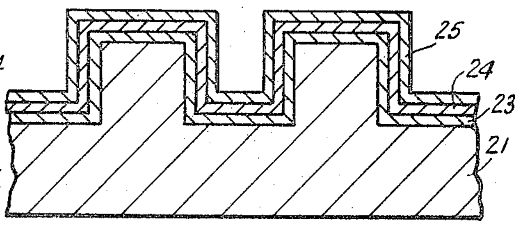
Figure 2E:
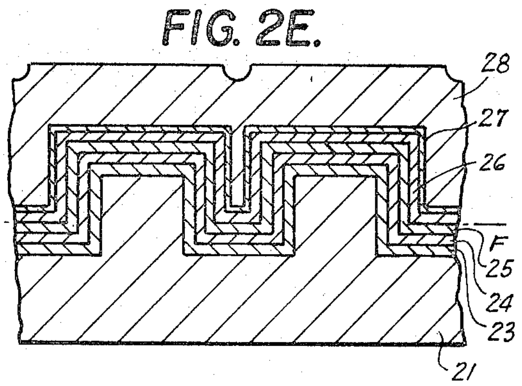
Figure 2F:
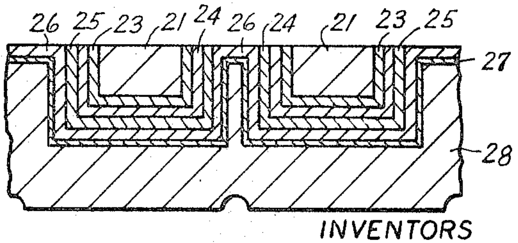

As shown on FIG. 2A, the first step is to provide projecting portions 22, which may define the area and shape of the finished semiconductor junctions (PN junctions), on a semiconductor substrate 21, for example, an $N^+$-type monocrystalline silicon substrate, by selective etching thereof. Then a P-type base layer 23 is deposited on the upper surface of the substrate 21 by the vapor growth technique, as illustrated in FIG. 2B, and in this case the $N^+$-type silicon substrate 21 is used as an emitter region. Following the formation of the P-type base layer 23, an N-type collector layer 24 is formed on the base layer 23 by the vapor growth technique, as depicted in FIG. 2C, after which an $N^+$-type layer 25 is similarly deposited on the collector layer 24 by the vapor growth technique, as shown in FIG. 2D. Thereafter, an insulating material layer 26, for example, of $SiO_2$, a SiC layer 27 and a polycrystalline silicon layer 28 are sequentially formed on the $N^+$-type layer 25 by the vapor growth technique, as depicted in FIG. 2E. The resulting element is subjected to etching and grinding at its underside, as viewed on FIG. 2E, to selectively remove the portion thereof underlying the line F—F or a little more, thereby providing semiconductor devices, as illustrated in FIG. 2F. If desired, the etching and grinding may be effected to such an extent as to expose the polycrystalline silicon layer 28.

The above method provides the base and collector layers 23 and 24 by means of vapor growth techniques and hence readily permits accurate control of their thickness and impurity concentration gradient. Further, it is also possible to obtain an impurity concentration gradient of the base layer 23 which results in there being provided therein an acceleration field, thereby ensuring appreciable improvements in the current amplification degree $h_{FE}$ and other characteristics of a resulting transistor. In addition, since all of layers 23 to 28 are applied by the vapor growth technique, the application of all of such layers can be carried out continuously in one furnace or in a continuous furnace. This results in remarkable simplification of the manufacturing operations and in a considerable saving of the time required therefor. For example, the time required for a single diffusion process is as long as about one hour, while the time for one vapor growth process is only several minutes. Furthermore, the vapor growth technique does not require removal of the element from the furnace for masking it, as is required for each diffusion process in the diffusion method. Since the element may remain in the furnace, the possibility of contamination of the element by unnecessary gas and dust is eliminated. The base and collector layers are each formed by a single vapor growth process to ensure precise control of the impurity concentrations therein, and hence the products of the method according to the invention have greater uniformity and enhanced characteristics as compared with those of the diffusion method.

Although the invention has been described above in connection with substrate 21 having formed thereon the projecting portions 22 defining the semiconductor junction areas, the present invention is similarly applicable to a substrate with recessed portions formed therein, as shown on FIGS. 3A–D.

Figure 3A:
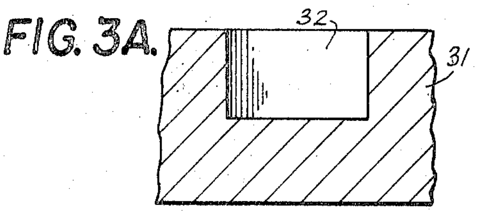
Figure 3B:
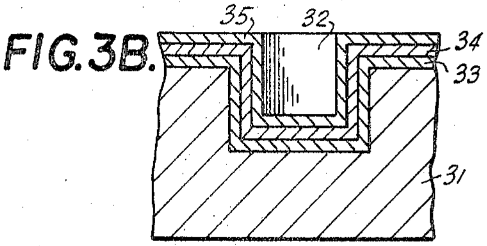
Figure 3C:
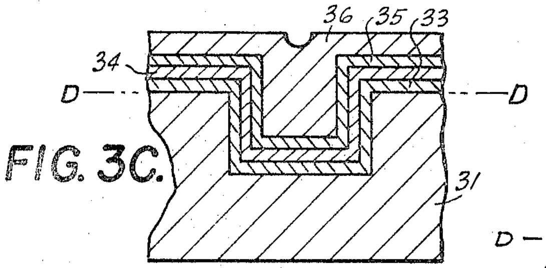
Figure 3D:
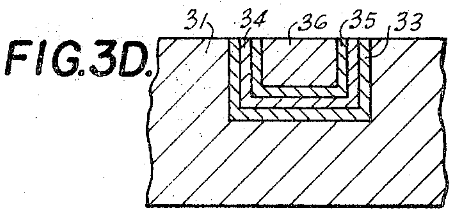

In this case, a semiconductor substrate 31, for example, a P-type monocrystalline silicon substrate, is subjected to selective etching to provide therein recessed portions 32 defining the semiconductor junction areas ultimately to be obtained, as shown in FIG. 3A. Then, an $N^+$-type layer 33, an N-type collector layer 34 and a P-type base layer 35 are sequentially deposited on the interior surface of each recessed portion 32 by means of vapor growth techniques, as depicted in FIG. 3B. Further, an $N^+$-type emitter layer 36 is likewise formed on the base layer 35 by the vapor growth technique, as illustrated in FIG. 3C. Thereafter, the resulting element is subjected to etching and grinding to selectively remove the portion thereof overlying the line D—D or a little more, as viewed on FIG. 3D, thereby providing a semiconductor device, namely an NPN-type transistor, such as is depicted in FIG. 3D.

In this embodiment of the invention, the base layer 35 is also formed by a single vapor growth process, and hence its thickness can be controlled as desired. Accordingly, since the base layer 35 can be formed with a thickness as small as 0.5 micron, the current amplification degree $h_{FE}$ and other characteristics of the transistor can be remarkably enhanced. Further, all layer applications are accomplished by the vapor growth technique and consequently the operations can be effected continuously in a single furnace with all of the advantages previously mentioned in connection with the embodiment of FIG. 2.

In the embodiments illustrated in FIGS. 2 and 3, the base and collector layers exposed to the outside may be so thin that electrical connections thereto may be difficult to provide. A description will now be given of another embodiment of this invention by which such difficulty may be overcome.

Figure 4A:
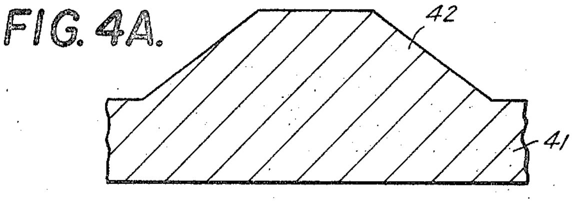
Figure 4B:
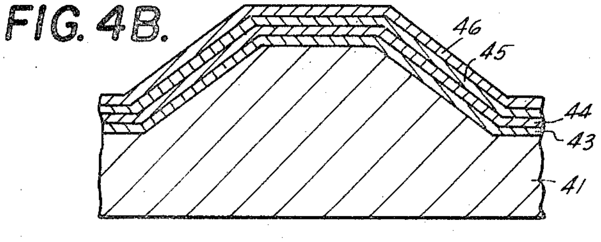
Figure 4C:
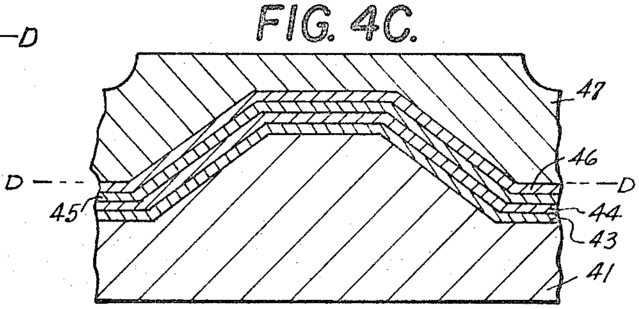

First of all, as shown on FIG. 4A, a semiconductor substrate 41, for example, an $N^+$-type monocrystalline silicon substrate, is subjected to selective etching to form thereon a projecting portion 41 of trapezoidal cross-section, that is, having inclined sides, and which defines the area of the semiconductor junctions ultimately obtained. In this case the $N^+$-type monocrystalline silicon substrate 41 is used as an emitter region. Then, a P-type base layer 43, an N-type collector layer 44, an $N^+$-type layer 45 and an insulating material layer 46, for example, of $SiO_2$, are sequentially deposited by the vapor growth technique on the entire surface of the projecting portion 42 of silicon substrate 41 as illustrated in FIG. 3B. Following this, a polycrystalline silicon layer 47 is similarly formed on the insulating material layer 46 by the vapor growth technique, as shown in FIG. 4C. Thereafter, the resulting element is etched and ground at its underside, as viewed on FIG. 4C, to selectively remove the portion underlying the line D—D or a little more, thus providing a semiconductor device, namely an NPN-type transistor as depicted in FIG. 4D.

Figure 4D:
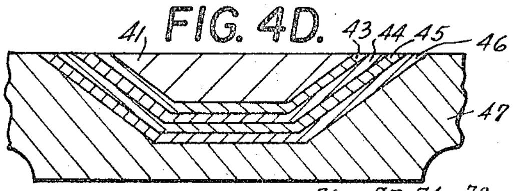
Figure 7D:
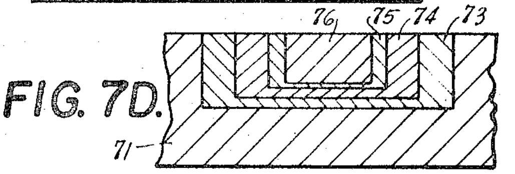

Since the projection portion 42 is trapezoidal in cross-section, and thus has inclined sides, the semiconductor layers of the semiconductor device are cut diagonally along the line D—D, as clearly shown in FIG. 4D. Thus, the semiconductor layers are cut obliquely to the direction of their thickness and the width of the exposed face or cross-section of each layer is greater than the thickness of the layer itself. Accordingly, where the base layer 43 is interposed between adjacent semiconductor layers is formed as thin as, for example, about 1 micron to provide for greatly enhanced high-frequency characteristics, the width of the exposed face of the base layer 43 is greater than that small thickness to facilitate attachment of electrodes to the base layer and hence simplify the manufacturing operations.

In the foregoing example the portion 42 of trapezoidal cross-section defining the areas of the semiconductor junctions is formed as a projection on the semiconductor substrate 41. However, it will be understood that, in the case where a recessed portion having a trapezoidal cross-section is formed in the semiconductor substrate and the semiconductor layers are sequentially deposited in the recessed portion by the vapor growth technique, attachment of electrodes to a particular semiconductor layer interposed between adjacent regions or layers is also similarly facilitated.

Generally, the directional dependency of the crystal growth speed of diamond type crystal is great due to its crystal structure. For example, in the case where a piece of round monocrystalline silicon rod with its axial direction lying in $\langle 111 \rangle$ (indicating generically $[111]$, $[1\bar{1}1]$, $[\bar{1}11]$ . . .) is subjected to a vapor growth process using a gas of $SiHCl_3$, the cross-section of the resulting element is usually as shown in FIG. 5A. That is, the crystal growth speed in the direction of $\langle 110 \rangle$ (indicating generically $[110]$, $[1\bar{1}0]$, $[\bar{1}10]$ . . .) is greater than that in the direction of $\langle 211 \rangle$ (indicating generically $[211]$, $[21\bar{1}]$, $[2\bar{1}1]$ . . .). Such anisotropy of the crystal due to its growth speed is dependent firstly upon the temperature used for crystal growth and secondly upon the kind and density of the gas employed.

Accordingly, in the manufacture of a semiconductor device, an integrated circuit or the like having a semiconductor junction (PN junction) formed by the vapor growth technique in accordance with this invention, it is possible to achieve speeds of crystal growth which narrow the base region but enlarge the exposed area thereof for electrode attachment by a suitable selection of the crystal face to form the junction when etching the monocrystalline substrate to form the projection or recess defining the semiconductor junction area. It has been found that the purpose of this invention is accomplished by forming, for example, the projecting portion mentioned above in such a manner that its upper surface or face offset from the surrounding surface areas may be of the crystal face $[111]$ of small crystal growth speed and its sides may be of the crystal faces $[1\bar{1}0]$ and $[\bar{1}10]$ of great crystal growth speed, as illustrated in FIG. 5B.

Figure 6A:
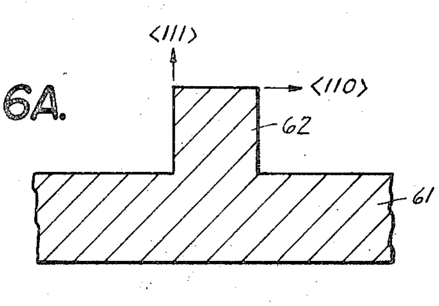
Figure 8B:
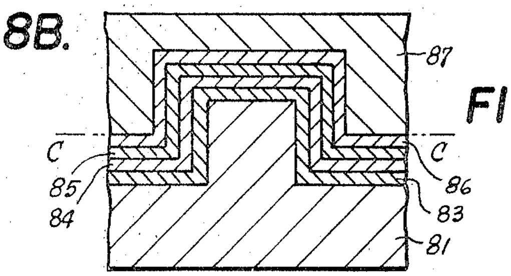
Figure 6B:
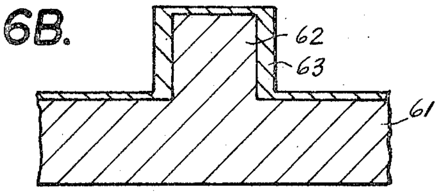
Figure 8C:
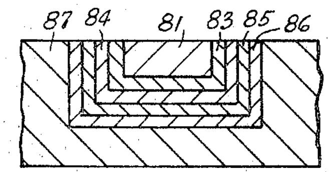
Figure 6C:
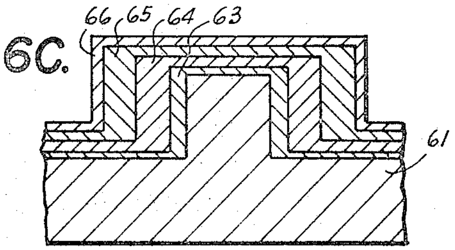
Figure 8D:
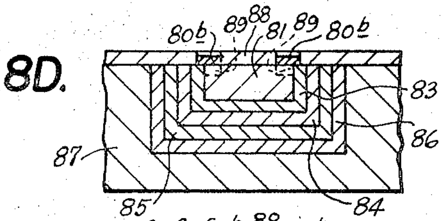
Figure 6D:
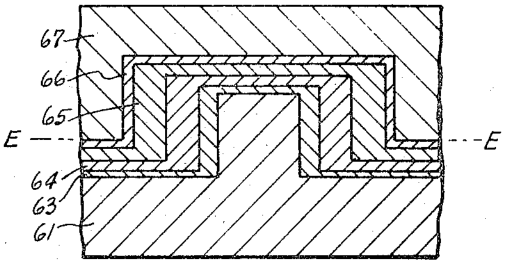
Figure 8E:
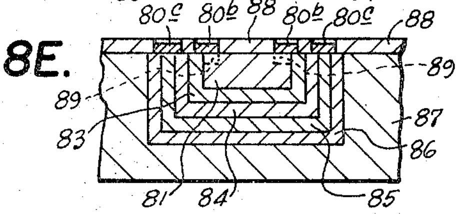
Figure 8F:
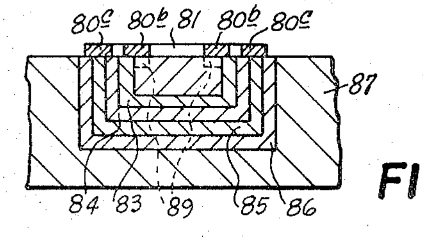
Figure 6E:
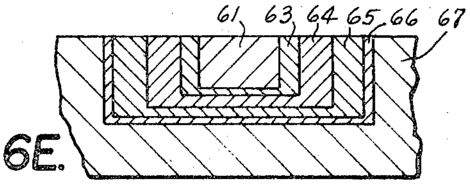
Figure 9A:
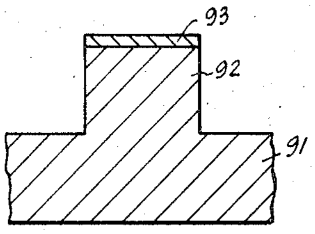
Figure 10A:
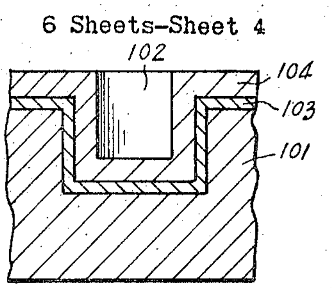
Figure 9B:
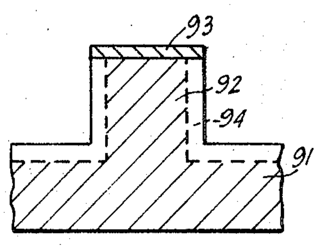
Figure 10B:
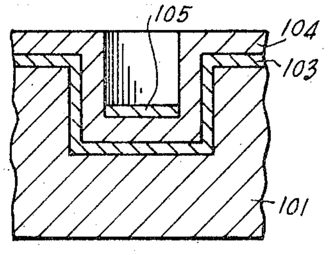
Figure 9C:
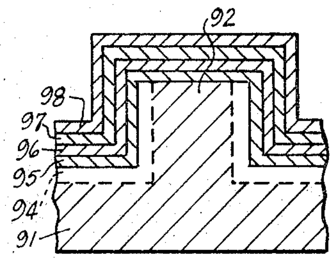
Figure 10C:
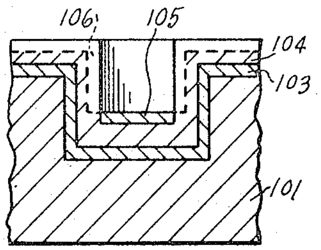
Figure 9D:
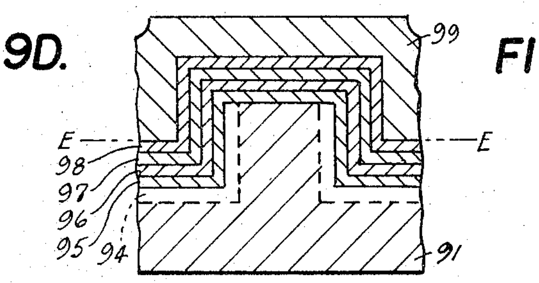
Figure 10D:
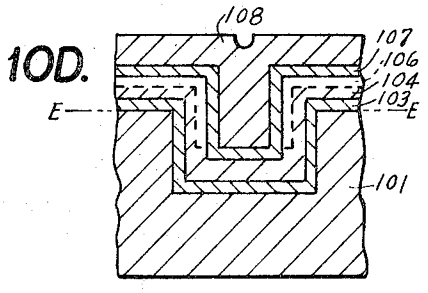
Figure 9E:
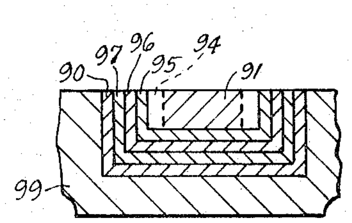
Figure 10E:
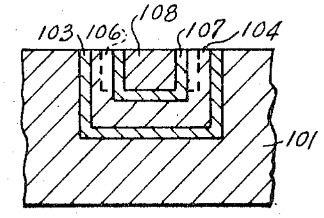
Figure 11A:
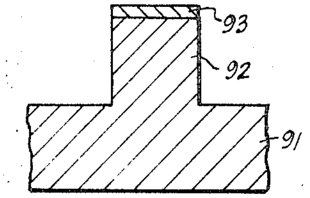
Figure 12A:
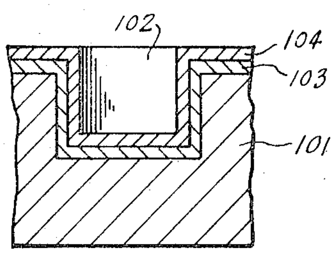
Figure 11B:
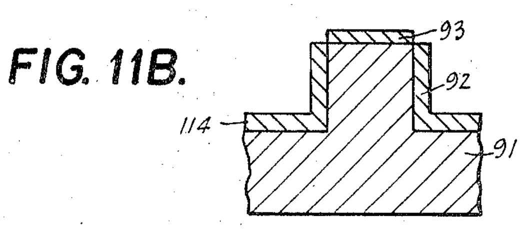
Figure 12B:
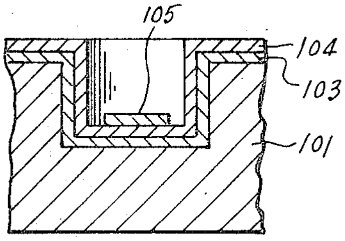
Figure 11C:
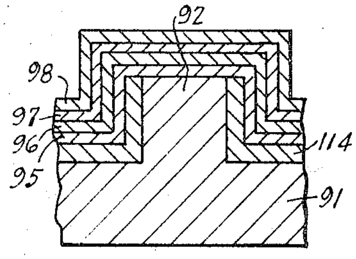
Figure 12C:
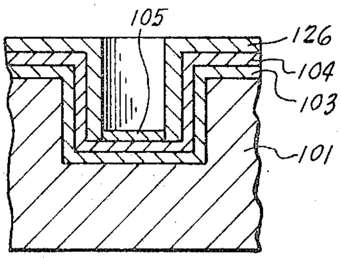
Figure 11D:
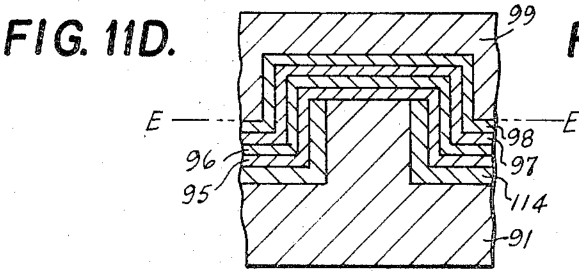
Figure 12D:
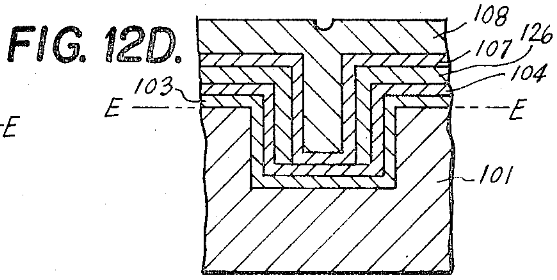
Figure 11E:
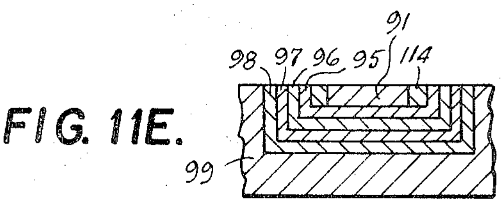
Figure 12E:
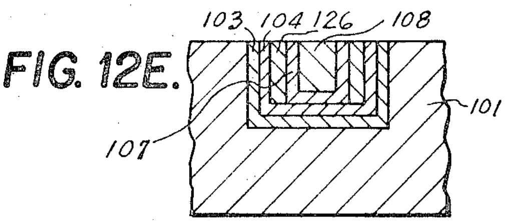
Figure 13A:
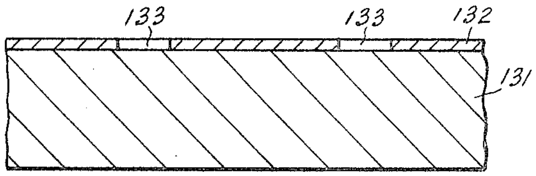
Figure 13B:
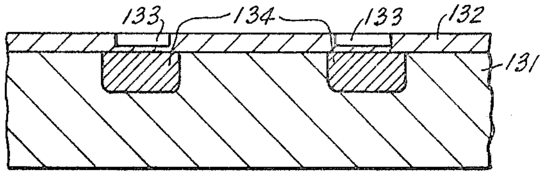
Figure 13C:
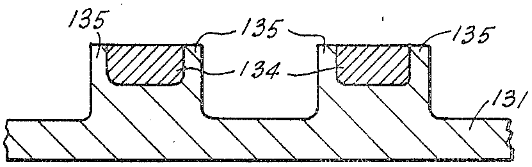
Figure 13D:
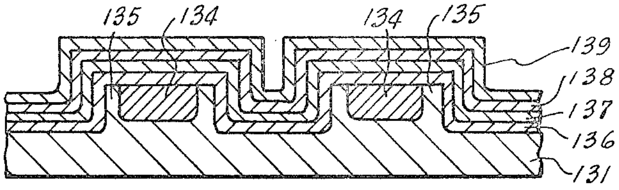
Figure 13E:
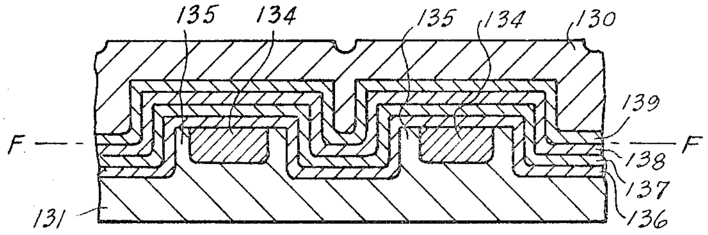
Figure 13F:
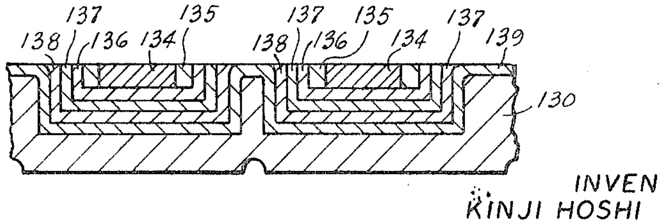

The foregoing feature is incorporated in the embodiment of FIG. 6 wherein a semiconductor substrate 61, for example, of $N^+$-type monocrystalline silicon, has a projecting portion 62 formed by selective etching for defining the area and shape of the semiconductor junction, as depicted in FIG. 6A. In this case, the upper or offset face of the projecting portion 62 is constituted by the face $[111]$ of small crystal growth speed and its sides, namely the left and right sides as viewed in the drawing, are constituted by the faces $[1\bar{1}0]$ and $[\bar{1}10]$ of great crystal growth speed. Then, a P-type base layer 63 is formed on the upper surface of substrate 61 by the vapor growth technique, as depicted in FIG. 6B. In this case the $N^+$-type monocrystalline silicon layer 61 is used as an emitter region of a transistor ultimately obtained. Further, an N-type collector layer 64, an $N^+$-type layer 65 and an insulating material layer 66, for example, of $SiO_2$, are sequentially deposited on the base layer 63 by the vapor growth technique, as shown in FIG. 6C. Thereafter, a monocrystalline silicon layer 67 is likewise formed on the insulating material layer 66 by the vapor growth technique, as illustrated in FIG. 6D. Finally, the resulting element is etched and ground from its underside, as viewed on FIG. 6D, up to the line E—E or a little higher to provide an NPN-type transistor such as shown in FIG. 6E.

Since the face of the projecting portion 62, that is, the face $[111]$ has a smaller crystal growth speed than both sides, namely the faces $[1\bar{1}0]$ and $[\bar{1}10]$, the portions of the base layer 63, the collector layer 64, the $N^+$-type layer 65 and so on overlying the upper face of projecting portion 62 are thinner than those formed on the sides, with the difference in the thicknesses being determined by the difference in the crystal growth speeds. Therefore, even if the thickness of the base layer 63 in the direction of $\langle 111 \rangle$ is as thin as, for instance, 1 micron to provide for enhanced high-frequency characteristics, the base layer 63 can be made thick enough, in the direction of <110>, to facilitate attachment of an electrode to the layer.

Although the semiconductor substrate of FIG. 6 is formed with a projecting portion 62 to define the area and shape of the semiconductor junctions, the feature of the invention there illustrated can similarly be applied to a semiconductor substrate formed with a recessed portion, for example, as hereinafter described with reference to FIG. 7.

Figure 7A:
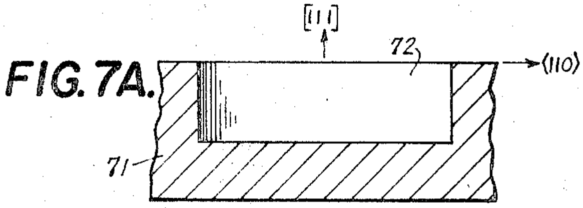
Figure 7B:
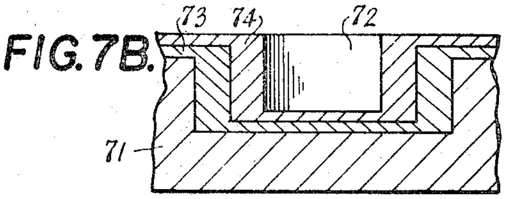
Figure 7C:
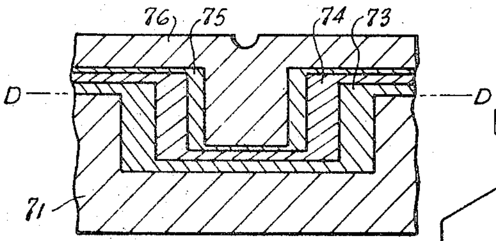

The method illustrated by FIG. 7 begins with the formation, as by selective etching, of a recessed portion 72 in a semiconductor substrate 71, for example, of P-type monocrystalline silicon, as shown in FIG. 7A. In this case, the bottom face of the recessed portion 72 is the crystal face [111] of small crystal growth speed while both side walls, namely the left and right side walls of the recessed portion 72 in the drawing, are constituted by the crystal faces [$1\bar{1}0$] and [$\bar{1}10$] of great crystal growth speed. After the formation of the recessed portion 72, an $N^+$-type layer 73 and an N-type collector layer 74 are sequentially deposited on the interior surface of the recessed portion 72 by the vapor growth technique, as depicted in FIG. 7B. Further, a P-type base layer 75 and a $N^+$-type emitter layer 76 are similarly formed on the collector layer 74 by the vapor growth technique, as illustrated in FIG. 7C. Thereafter, the resulting element is etched and ground from its underside up to the line D—D or a little past it, to provide a semiconductor device, namely, an NPN-type transistor, as depicted in FIG. 7D.

Here again, since the bottom face of the recessed portion 72, that is, the crystal face [111] has a lower crystal growth speed than both side walls, namely the crystal faces [$1\bar{1}0$] and [$\bar{1}10$], the $N^+$-type layer 73, the portions of the collector layer 74, the base layer 75 and so on overlying the bottom face of the recessed portion 72 can be made thinner than the portions of such layers on the side walls in accordance with the difference in the crystal growth speeds of the crystal faces. Accordingly, attachment of the electrode to the base layer can be readily accomplished as described previously.

In our experiments in which a vapor growth layer was formed by using a gas of $SiHCl_3$ at a temperature of 1100° C., when thickness of the layer in the direction of <111> was 2 microns, that of the layer in the direction of <110> was 5 microns.

In FIGS. 6 and 7 the sides of projecting portion 62 and of recessed portion 72 of the semiconductor substrate are perpendicular to the face thereof which is offset relative to the surrounding areas of the substrate surface. However, in the embodiments of FIGS. 6 and 7 the sides of the projecting and recessed portions of the substrates can be inclined, as described above with reference to FIG. 4, whereby to still further increase the effective width of the exposed cross-section of each layer for ease of attachment of an electrode thereto.

Figure 8A:
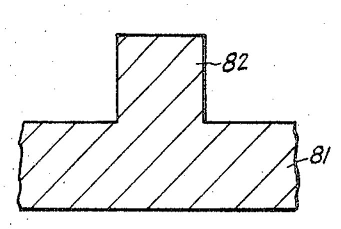

In the embodiment of the invention illustrated in FIG. 8, a semiconductor substrate 81, for example, of $N^+$-type monocrystalline silicon, is formed with a projecting portion 82, as illustrated in FIG. 8A. Then, a P-type base layer 83, an N-type collector layer 84, an $N^+$-type layer 85, an insulating material layer 86 of $SiO_2$ or the like and a polycrystalline silicon layer 87 are sequentially deposited on the upper surface of the substrate 81 by means of the vapor growth technique, as shown in FIG. 8B. Thereafter, the resulting element is etched and ground from its underside up to the line C—C or a little past it to provide a semiconductor device, namely an NPN-type transistor, as shown in FIG. 8C. Thereafter, a resist layer 88, for example, of $SiO_2$, is formed on the ground surface of the transistor, and the portion of the layer 88 overlying the emitter region 81 and the base region 83 is selectively removed by means of etching to provide an aperture or void area. Then, a metal, for example, aluminum, is vapor-deposited in the aperture or void area, providing an additional base region 89 of alloy junction in one selected portion of the emitter region 81 while at the same time forming a base electrode **80*b* with the vapor-deposited metal, as illustrated in FIG. 8D. Next, a metal, such as aluminum, is similarly vapor-deposited over the collector layer 84 and the $N^+$-type layer 85 in a manner to form an ohmic contact, thus providing a collector electrode 80*c***, as depicted in FIG. 8E.

With such an arrangement as above described, the base region consists of the base layer 83 and the additional base region 89 of the same conductivity type, so that the area of the base region is increased and the base electrode **80*b*** is simultaneously formed on the base region.

According to our experiments, when aluminum is vapor-deposited on an N-type silicon at 510° C. for three minutes and thereafter the temperature is raised up to 580° C. to 590° C., the deposited aluminum forms an alloy junction with the N-type silicon, as at 89. Further, when aluminum is vapor-deposited at 510° C. for 15 second and then the resulting element is left for 3 minutes, the deposited aluminum forms an ohmic contact with the N-type silicon, as at **80*c***. In this case, it is to be understood, of course, that metals other than aluminum can be employed, so long as they are capable of forming an alloy junction or ohmic contact.

Although the above is concerned specifically with the semiconductor substrate 81 formed with a projecting portion 82 defining the semiconductor junction area, it will be apparent that in the case where a recessed portion is formed in a semiconductor substrate and semiconductor regions are sequentially formed in the concave portion by vapor growth techniques, as in FIGS. 2 and 7, a similar additional semiconductor region of alloy junction can be formed to obtain results similar to those described above with reference to FIG. 8.

In FIG. 9 there is illustrated another example of this invention, in which, initially an $N^+$-type monocrystalline silicon substrate 91 is formed with a projecting portion 92. On the face of projecting portion 92 is formed an insulating layer 93 of $SiO_2$, SiC or the like, as illustrated in FIG. 9A. The insulating layer 93 may readily be formed by applying a coating of $SiO_2$ to the entire surface of a flat monocrystalline silicon substrate and then selectively etching the coating and the substrate. Next, the monocrystalline silicon substrate 91 is subjected to a diffusion process of a P-type impurity with the insulating material layer 93 serving as a mask, thereby providing an additional P-type base layer 94, as shown in FIG. 9B. In this case the monocrystalline silicon layer 91 is used as an emitter region. Following the formation of the additional P-type base layer 94, the insulating layer 93 is removed, and then a P-type base layer 95, and N-type collector layer 96, an $N^+$-type layer 97 and an insulating layer 98 of $SiO_2$ are sequentially deposited on the substrate 91 by vapor growth techniques, as illustrated in FIG. 9C. Further, a polycrystalline silicon layer 99 is formed continuously on the insulating material layer 98 by the vapor growth technique, as shown in FIG. 9D. Thereafter, the resulting element is etched and ground from its underside up to the line E—E to provide an NPN-type transistor, as shown in FIG. 9E. Since the additional base region 94 is previously formed on the side walls of the projecting portion 92 by means of the diffusion technique, the final effective base region consists of the additional base layer 94 and the base layer 95. As a result of this, the base region is wide at the portion thereof on which the base electrode is disposed, while the central portion of the base region extending across the face of projecting portion 92 and which is closely related to the characteristics of the finished semiconductor device is extremely thin, since such central portion of the base region is a semiconductor region formed by only a single vapor growth process. Therefore, even if the central portion of the base region is extremely thin, the base electrode can readily be attached to the base region without any difficulty. Further, the semiconductor layers can be sequentially formed by the vapor growth technique in a single furnace after the removal of the insulating layer 93, so that the previously described advantages of the present invention are achieved.

In the formation of the additional base layer 94 by diffusing a P-type impurity into the $N^+$-type emitter region 91, the diffusion of the P-type impurity is difficult to effect if the emitter region is highly doped. In order to overcome this difficulty, it is preferred to effect the diffusion after heating the silicon substrate 91 in a vacuum to lower the impurity concentration of the surface of the portion 92 which ultimately serves as an $N^+$-type emitter. This is unnecessary, of course, when the substrate is not highly doped.

FIG. 10 illustrates another example of this invention as applied to a semiconductor substrate formed with a recessed portion 102 instead of a projecting portion as in FIG. 9. Such recessed portion 102 is first formed in a P-type monocrystalline silicon substrate 101, after which an $N^+$-type layer 103 and an N-type collector layer 104 are sequentially deposited by vapor growth techniques on the faces defining the recessed portion 102, as depicted in FIG. 10A. This is followed by the formation of an insulating material layer 105, for example, of $SiO_2$, on the collector layer 104 at the bottom of the recess, as shown in FIG. 10B. Thereafter, an additional P-type base layer 106 is formed in the collector layer 104 by a diffusion process with the insulating layer 105 serving as a mask, as shown in FIG. 10C. After the formation of the additional P-type base layer 106, the insulating layer 105 is removed, and then a P-type base layer 107 and an $N^+$-type emitter layer 108 are sequentially deposited by vapor growth techniques, as depicted in FIG. 10D. Next, the resulting element is etched and ground from its upper surface down to the line E—E or a little past it, providing an NPN-type transistor, as depicted in FIG. 10E.

FIG. 11 illustrates still another embodiment of this invention, which is the same as the embodiment shown in FIG. 9 except for the use of the vapor growth technique for the formation of an additional base layer 114. Hence, in FIG. 11 parts similar to those in FIG. 9 are identified by the same reference numerals. In a transistor produced according to this example, the base region is also substantially thickened at the portion on which the base electrode is located, while its central portion which determines the characteristics of the transistor can be of very small thickness, as shown in FIG. 11E, since it is a semiconductor region deposited by a single vapor growth process. Therefore, the thin base region does not introduce any difficulty in the mounting of the base electrode on the base region. Further, the semiconductor layers can be formed continuously by the vapor growth technique in a single furnace after removal of the insulating material layer 93, and this simplifies the manufacturing process and shortens the time required therefor.

FIG. 12 illustrates a further example of this invention, which is the same as the example shown in FIG. 10, except for the use of the vapor growth technique for the formation of an additional base layer 126. Here again, parts similar to those in FIG. 10 are identified by the same reference numerals, and no description will be given in connection therewith. It will be apparent that this example also provides the same advantageous results as those obtained wtih the example of FIG. 10.

FIG. 13 illustrates still a further example of this invention. As a first step, an insulating material layer 132 for example, of $SiO_2$ is deposited on the entire upper surface of a semiconductor substrate 131, for instance, of P-type monocrystalline silicon, and then selected areas of the insulating material layer 132 are removed by means of etching to provide apertures 133, as illustrated in FIG. 13A. Following this, an $N^+$-type impurity is diffused through each aperture 133 into the silicon substrate 131 to form therein an emitter region 134, as depicted in FIG. 13B. Next, the substrate 131 is subjected to an etching process to remove the insulating material layer 132 and portions of the substrate surrounding the emitter region 134, leaving the emitter regions 134 and additional surrounding base regions 135 which project beyond the remainder of substrate 131, as illustrated in FIG. 13C. Thereafter, a P-type base layer 136, an N-type collector layer 137, an $N^+$-type layer 138 and an insulating material layer 139, for example, of $SiO_2$, are sequentially deposited on the silicon substrate 131 by vapor growth techniques, as depicted in FIG. 13D. Further, a polycrystalline layer 130 is likewise deposited on the insulating material layer 139 by the vapor growth technique, as shown in FIG. 13E. The resulting element is etched and ground from its underside up to the line F—F on FIG. 13E to provide a semiconductor device such as is illustrated in FIG. 13F, and in which the exposed base 135 and base layer 136 provide a relatively wide region for attachment of the base electrode.

While the present invention has been described in connection with the production of NPN-type transistors, it will be understood that the invention is applicable to other semiconductor devices, such as PNP-type transistors, NIPI-type transistors, integrated circuits, switching devices and so on. Further, it is to be understood that the methods of formation of the semiconductor regions, their conductivity types, the method of formation and kinds of the insulating material layers, the shapes and kinds of the semiconductor substrates are not limited specifically to those described by way of example in the foregoing embodiments, but that they may be modified as desired.

In the methods according to this invention, it is preferred that the substrate be doped with an impurity, such as antimony, arsenic or the like, rather than phosphorus, and that gaseous $SiH_4$ be employed instead of $SiCl_4$ for the vapor growth processes. The temperature used for the vapor growth processes is preferably maintained low enough so as not to damage the crystallization of the growth layers.

It will be apparent that many modifications and variations in addition to those specifically noted above may be effected in the described embodiments without departing from the scope or spirit of this invention as defined in the appended claims.

What is claimed is:

1. A method of manufacturing a semiconductor device comprising the steps of forming a surface of a semiconductor substrate with at least one profiled portion which has a face offset with respect to surrounding areas of said surface and sides extending from said face to said surrounding areas of the surface, sequentially depositing on said surface by the vapor growth technique at least two layers of different conductivity types to cover at least said face and sides of said profiled portion and to provide with the covered face and sides of said profiled portion all junctions of the semiconductor device, and, only after such provision of all junctions of the device, selectively removing from the resulting element sufficient material to expose, adjacent said sides of the profiled portion, a cross-section of at least the layer which is closest thereto.

2. The method according to claim 1, in which said sides of the profiled portion are inclined so that the width of the exposed cross-section of a layer is substantially greater than the thickness of the latter for facilitating the attachment of an electrode thereto.

3. The method according to claim 1, in which said profiled portion is selectively located with respect to said substrate so that said face of the profiled portion corresponds to a crystal face of relatively small crystal growth speed and at least one of said sides of the profiled portion corresponds to a crystal face of relatively large crystal growth speed, whereby said layer closest to said profiled portion has a greater thickness at said one side of the profiled portion than at said face of the latter for facilitating the attachment of an electrode at the exposed cross-section thereof.

4. The method according to claim 1, in which a surface region of the semiconductor device adjacent one of said layers having an exposed cross-section is alloyed so as to be of the same conductivity type as said one layer, whereby to facilitate the attachment of an electrode to said one layer.

5. The method according to claim 1, in which, prior to the deposit of one of said layers to cover at least said face and sides of said profiled portion, there is deposited on no more than said sides of the profiled portion a layer of the same conductivity type as the next layer to be deposited so that a relatively large width of the conductivity type of said next layer is provided at the exposed cross-section thereof for ease of attachment of an electrode thereto.

6. The method, according to claim 5, in which said one of said layers is the first of said layers, and said next layer to be deposited is also the first layer to be deposited.

7. The method according to claim 6, in which said layer deposited on no more than said sides of the profiled portion is applied by the diffusion process.

8. The method according to claim 6, in which said layer deposited on no more than said sides of the profiled portion is also applied by the vapor growth technique.

9. The method, according to claim 7, in which prior to the diffusion process, the substrate is heated in a vacuum to lower the surface impurity concentration of said underlying portion.

10. The method, according to claim 5, in which said one of said layers is the third layer, and said next layer to be deposited is said third layer.

11. The method, according to claim 10, in which said layer deposited on no more than said sides of the profiled portion is applied by the diffusion process.

12. The method, according to claim 10, in which said layer deposited on no more than said sides of the profiled portion is applied by the vapor growth technique.

13. The method according to claim 1, in which, prior to the deposit of said layers, there are diffused into a region of said surface which is smaller than and lies within the area of said face of the profiled portion impurities to provide therein a conductivity type opposite to that of said substrate, and the first of said layers deposited on the substrate is of the same conductivity as said substrate so that the width of the exposed cross-section of said first layer is effectively increased by the adjacent exposed area of said substrate of the same conductivity type to facilitate the attachment of an electrode to said first layer.

14. The method according to claim 8, in which said impurities are diffused into said region of the substrate surface prior to the forming of said surface with said profiled portion.

15. The method according to claim 1, in which said profiled portion is a projection, and said material is removed from said substrate at the surface of the latter opposed to said surface formed with said projection so as to leave only said profiled portion of the substrate.

16. The method according to claim 1, in which said profiled portion is a recess, the last deposited of said layers fills said recess, and said material is removed from the surface of the element constituted by said layers so as to expose cross-sections of said layers within said recess.

References Cited

UNITED STATES PATENTS

| | | | |
|---|---|---|---|
| 3,264,149 | 8/1966 | Batdorf et al. | 148—1.5X |
| 3,268,374 | 8/1966 | Anderson | 148—175 |
| 3,372,063 | 3/1968 | Suzuki et al. | 148—175X |
| 3,411,200 | 11/1968 | Founigone | 148—187X |
| 3,421,205 | 1/1969 | Pollock | 148—175X |
| 3,425,879 | 2/1969 | Shaw et al. | 148—175 |
| 3,454,434 | 7/1969 | Jackson et al. | 148—174X |
| 3,466,741 | 9/1969 | Wiesner | 148—1.5X |
| 3,498,853 | 3/1970 | Dathe et al. | 148—187 |

OTHER REFERENCES

Maxwell et al.: "The Minimization of Parasitics in Integrated Circuits by Dielectric Isolation, reprint from IEEE Transactions on Electron Devices, vol. ED–12, No. 1, January 1965, pp. 20–25.

ALLEN B. CURTIS, Primary Examiner

U.S. Cl. X.R.

148—175, 186